United States Patent

Kortge et al.

[15] 3,671,751

[45] June 20, 1972

[54] PHOTON ENERGY DETECTOR GENERATING SIGNAL IN WHICH DURATIONS OF FIRST AND SECOND HALF CYCLES ARE RESPONSIVE TO PHOTON ENERGY AND DIODE CONTINUITY RESPECTIVELY

[72] Inventors: Jerry W. Kortge; James A. Rodaer, both of Kokomo, Ind.

[73] Assignee: General Motors Corporation, Detroit, Mich.

[22] Filed: Sept. 18, 1970

[21] Appl. No.: 73,501

[52] U.S. Cl. ..........................................250/211 J, 331/066

[51] Int. Cl. ......................G01j 5/00, G01k 7/00, H01j 39/12

[58] Field of Search .................................331/66; 250/211 J

[56] References Cited

UNITED STATES PATENTS 1,886,813 11/1932 Hulburt et al. ......................331/66 X 3,304,430 2/1967 Biard et al. ..........................250/211 J

*Primary Examiner*—James W. Lawrence

*Assistant Examiner*—T. N. Grigsby

*Attorney*—E. W. Christen, C. R. Meland and Tim G. Jagodzinski

[57] ABSTRACT

A relaxation oscillator produces a cyclical output signal having alternate first and second half cycles. The oscillator includes a timing circuit having a resistance-capacitance network. The resistance includes a PIN photo diode which exhibits a reverse leakage current responsive to the photon energy incident upon the diode. The photo diode defines the duration of the first half cycles as a function of the reverse leakage current of the diode and defines the duration of the second half cycles as a function of the forward drive current of the diode. The first and second half cycles of the output signal are averaged to provide an output level having a magnitude which is responsive to the photon energy incident upon the photo diode and is responsive to the continuity of the photo diode.

3 Claims, 2 Drawing Figures

INVENTORS
BY Jerry W. Kortge &
James A. Kodaer
[signature]
ATTORNEY

PHOTON ENERGY DETECTOR GENERATING SIGNAL IN WHICH DURATIONS OF FIRST AND SECOND HALF CYCLES ARE RESPONSIVE TO PHOTON ENERGY AND DIODE CONTINUITY RESPECTIVELY

The invention herein described was made in the course of work under a contract or subcontract thereunder with the Department of Defense.

This invention relates to a photon energy detector utilizing a PIN photo diode as a radiation sensor.

It is well known that a semiconductor diode having a PIN junction structure exhibits a reverse leakage current which is a direct function of the photon energy incident upon the diode. As a result, a PIN photo diode may be utilized as a radiation sensor in a photon energy detector such as a heat or light detector. However, when no photon energy is incident upon a PIN photo diode, the reverse leakage current is substantially nil. This is the dormant condition. Of course, the same result obtains if a PIN photo diode is open circuited. This is the failed condition. Consequently, based upon the reverse leakage current of a PIN photo diode, it is virtually impossible to distinguish between the dormant condition and the failed condition. This is a severe deficiency which is remedied by the present invention.

According to one aspect of the invention, an oscillator produces a cyclical output signal having alternate first and second half cycles. The oscillator includes a timing circuit having a PIN photo diode for independently varying the duration of the first and second half cycles of the output signal in response to the photon energy incident upon the diode and in response to the continuity of the diode. More specifically, the duration of the first half cycles is defined as a function of the reverse leakage current of the photo diode and the duration of the second half cycles is defined as a function of the forward drive current of the photo diode. Consequently, the first half cycles of the output signal indicate the photon energy incident upon the photo diode while the second half cycles of the output signal indicate the continuity of the photo diode.

In another aspect of the invention, the timing circuit includes a capacitor connected with a resistor network. The resistor network includes first and second parallel legs. The first leg includes the PIN photo diode connected in series with a first resistance. The second leg includes a PN control diode connected in series with a second resistance. The photo diode and the control diode are poled in opposite directions, and the second resistance is substantially greater than the first resistance. As a result, the duration of the first half cycles of the output signal is primarily a function of the reverse leakage current through the photo diode when photon energy is incident upon the photo diode and is primarily a function of the forward drive current through the control diode when photon energy is not incident upon the photo diode. Further, the duration of the second half cycles of the output signal is primarily a function of the forward drive current through the photo diode when the photo diode has continuity and is primarily a function of the reverse leakage current through the control diode when the photo diode does not have continuity.

As contemplated by a further aspect of the invention, an integrator averages the first and second half cycles of the output signal to provide an output level. The magnitude of the output level is not only responsive to the photon energy incident upon the PIN photo diode, but is also responsive to the continuity of the PIN photo diode. More particularly, the magnitude of the output level when the photo diode is in the dormant condition is markedly different from the magnitude of the output level when the photo diode is in the failed condition. Accordingly, the failed condition is readily distinguishable from the dormant condition.

These and other aspects and advantages of the invention may be best understood by reference to the following detailed description of a preferred embodiment when considered in conjunction with the accompanying drawing.

Figure 1:
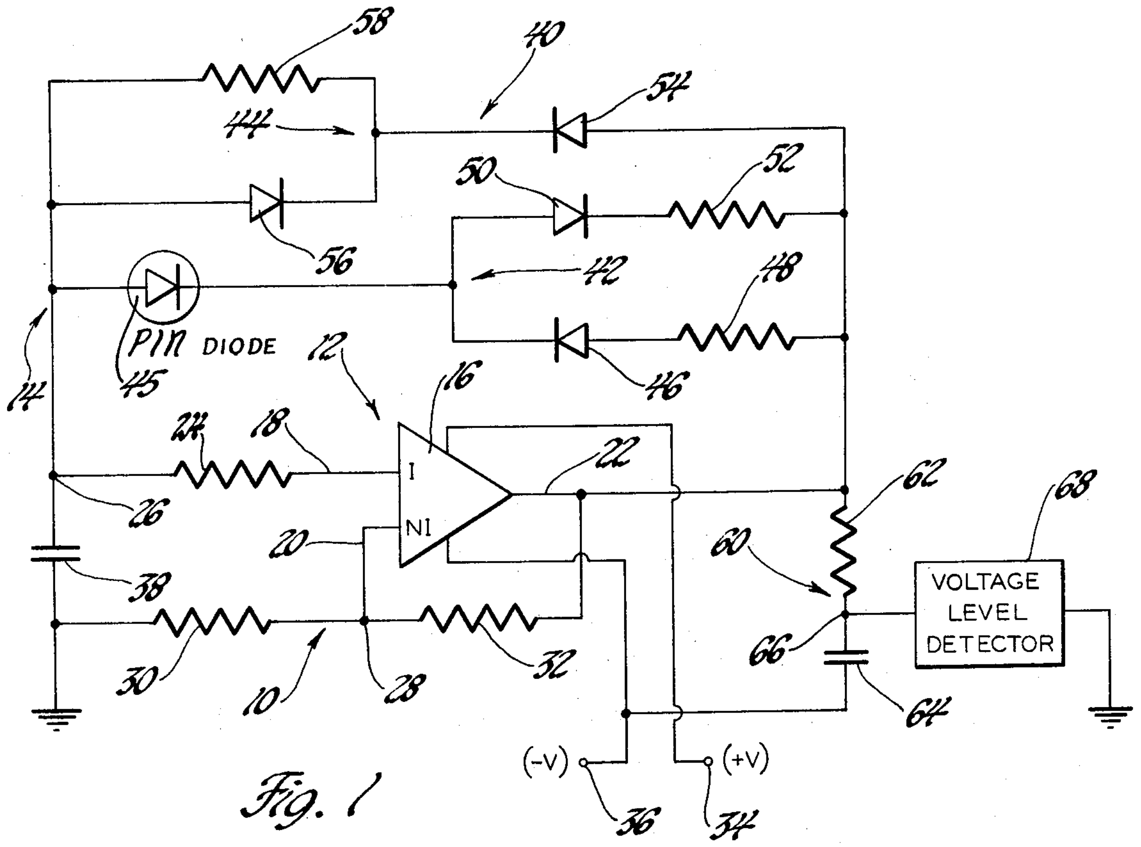
FIG. 1 is a schematic diagram of a photon energy detector incorporating the principles of the invention.

Referring to FIG. 1, the illustrated photon energy detector includes an oscillator 10 having a switching circuit 12 and a timing circuit 14. The switching circuit 12 includes a high gain differential amplifier 16 having an inverting or timing input 18, a noninverting or reference input 20 and an output 22. The input 18 is connected through a biasing resistor 24 to a junction 26 in the timing circuit 14. The input 20 is connected to a junction 28 between a pair of biasing resistors 30 and 32 which are connected in series between the output 22 and ground. A voltage supply (not shown) provides an upper or positive voltage level +V at a positive terminal 34 and provides a lower or negative voltage level −V at a negative terminal 36.

The timing circuit 14 includes a capacitor 38 and a resistor network 40. The capacitor 38 is connected between the junction 26 and ground. The resistor network 40 is connected between the junction 26 and the output terminal 22. The resistor network 40 includes first and second legs 42 and 44. The first leg 42 includes a photo diode 45 alternately connected in series with a first steering diode 46 and a first resistor 48 and connected in series with a second steering diode 50 and a second resistor 52. The second leg 44 includes a control diode 54 alternately connected in series with a third steering diode 56 and connected in series with a third resistor 58.

The photo diode 45 is a PIN diode which exhibits a reverse leakage current responsive to the photon energy incident upon the diode. Preferably, the control diode 54 and the first, second and third steering diodes 46, 50 and 56 are PN diodes. For reasons which become more apparent later, the third resistor 58 is substantially greater than the first resistor 48. Preferably, the third resistor 58 is at least three orders of magnitude greater than the first resistor 48.

The photo diode 45 and the control diode 54 are poled in opposite directions. In addition, the photo diode 45 and the first steering diode 46 are poled in opposite directions while the photo diode 45 and the second steering diode 50 are poled in like directions. Further, the control diode 54 and the third steering diode 56 are poled in opposite directions. Since the first steering diode 46 and the second steering diode 50 are oppositely poled, and the control diode 54 and the third steering diode 56 are oppositely poled, inherent temperature compensation is achieved, assuming a common heat sink.

In operation, a cyclical or square wave output signal is produced at the output 22 of the differential amplifier 16. The output signal alternately switches between the positive level +V and the negative level −V each time the magnitude of a timing signal applied to the timing input 18 approximately reaches the magnitude of a reference signal applied to the reference input 20. The timing signal is derived from the output signal through timing action of the capacitor 38 and the resistor network 40. The reference signal is derived from the output signal through the voltage divider action of the resistors 30 and 32. Consequently, the timing signal and the reference signal are in phase with the output signal. The timing signal is a sawtooth wave defined by the resistance-capacitance time constant provided by the capacitor 38 and the resistor network 40. Preferably, the resistance-capacitance time constant of the timing circuit 14 is selected so that the timing signal is essentially a linear sawtooth wave over the operating range of the oscillator 10. Of course, the reference signal is a square wave.

Assuming the output signal is at the positive level +V, current flows in a first direction through the resistor network 40 to positively charge the capacitor 38. The output signal switches to the negative level −V when the positive going magnitude of the timing signal approximately reaches the positive magnitude of the reference signal. With the output signal at the negative level −V, current flows in a second direction through the resistor network 40 to negatively charge the capacitor 38. The output signal switches to the positive level +V when the negative going magnitude of the timing signal approximately reaches the negative reference signal. Thus, the duration of the positive half cycles of the output signal is determined as a function of the current flow through the resistor network 40 in the first direction and the duration of the negative half cycles of the output signal is determined as a function of the current flow through the resistor network 40 in the second direction.

Figure 2:
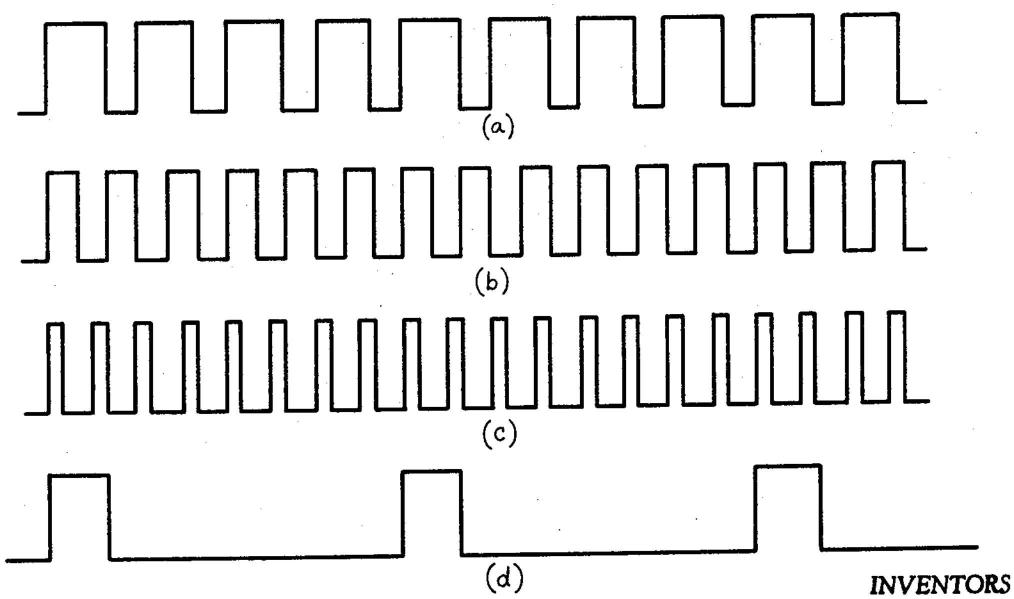
FIG. 2 is a graphic diagram of several waveforms useful in explaining the principles of the invention.

When no photon energy is incident upon the photo diode 45, the output signal takes the form illustrated in FIG. 2(*a*). This is the dormant condition. In the dormant condition, substantially no reverse leakage current flows through the photo diode 45. Accordingly, the duration of the positive half cycles of the output signal is primarily defined by the forward drive current through the control diode 54 in the second leg 44 of the resistor network 40. Specifically, current flows in the first direction through a path including the control diode 54 and the third resistor 58. Thus, the forward drive current through the control diode 54 is limited by the third resistor 58. The duration of the negative half cycles of the output signal is primarily defined by the forward drive current through the photo diode 45 in the first leg 42 of the resistor network 40. In particular, current flows in the second direction through a path including the photo diode 45, the second steering diode 50 and the second resistor 52. Hence, the forward drive current through the photo diode 45 is limited by the second resistor 52.

When photon energy is incident upon the photo diode 45, the output signal takes the form illustrated in FIGS. 2(*b*) and 2(*c*), by way of example. This is the active condition. In the active condition, a reverse leakage current flows through the photo diode 45. Since the third resistor 58 is substantially greater than the first resistor 48, the duration of the positive half cycles of the output signal is primarily defined by the reverse leakage current through the photo diode 45 in the first leg 42 of the resistor network 40. Specifically, current flows in the first direction through a path including the first resistor 48, the first steering diode 46 and the photo diode 45. Thus, the reverse leakage current through the photo diode 45 is limited by the first resistor 48. In general, the duration of the positive half cycles of the output signal is inversely related to the reverse leakage current of the photo diode 45. FIG. 2(*b*) illustrates a typical output signal for a first value of reverse leakage current. FIG. 2(*c*) illustrates a typical output signal for a second value of reverse leakage current, where the second value is greater than the first value. The duration of the negative half cycles of the output signal is primarily defined by the forward drive current through the photo diode 45 as previously described with respect to the dormant condition of the photo diode 45.

When the photo diode 45 is malfunctioned in an open circuit mode, the output signal takes the form illustrated in FIG. 2(*d*). This is the failed condition. In the failed condition, no forward drive current or reverse leakage current flows through the photo diode 45. Consequently, the duration of the positive half cycles of the output signal is primarily defined by the forward drive current through the control diode 54 as previously described with respect to the dormant condition of the photo diode 45. The duration of the negative half cycles of the output signal is defined by the reverse leakage current through the control diode 54 in the second leg 44 of the resistor network 40. In particular, current flows in the second direction through a path including the third steering diode 56 and the control diode 54.

An integrator 60 includes a resistor 62 and a capacitor 64. The resistor 62 is connected between the output 22 of the differential amplifier 16 and a junction 66. The capacitor 64 is connected from the junction 66 to the negative terminal 36. The integrator 60 averages the positive and negative half cycles of the output signal to provide an output level at the junction 66. The magnitude of the output level is a function of the photon energy incident upon the photo diode 45 and is also a function of the continuity of the photo diode 45. When the photo diode 45 is in the dormant condition, the output level assumes an upper magnitude. When the photo diode 44 is in the failed condition, the output level assumes a lower magnitude. Accordingly, the failed condition is readily distinguishable from the dormant condition. When the photo diode 45 is in the active condition, the output level assumes a magnitude somewhere between the upper and lower magnitudes responsive to the photon energy incident upon the photo diode 45.

A voltage level detector 68 is coupled to the junction 66 for monitoring the magnitude of the output level as an indication of the photon energy incident upon the photo diode 45 and as an indication of the continuity of the photo diode 45. The voltage level detector 68 may be provided by a conventional voltmeter or some other appropriate voltage responsive utilization device.

In a photon energy detector constructed in accordance with the drawing, the following components and values were found to yield satisfactory results:

| | |
|---|---|
| Amplifier **16** | Mod. $\mu$A741 (Fairchild Instrument) |
| PIN photo diode **45** | HP4204 Hewlett-Packard) |
| Capacitor **38** | 0.005$\mu$ farads |
| Capacitor **64** | 6$\mu$ farads |
| Resistors **24** and **30** | 3 K ohms |
| Resistor **32** | 30 K ohms |
| Resistor **62** | 10 K ohms |
| Resistor **48** | 300 K ohms |
| Resistor **52** | 100 K ohms |
| Resistor **58** | 1 M ohms |

It is to be understood that the preferred embodiment of the invention disclosed herein is shown for illustrative purposes only and that various alterations and modifications may be made to it without departing from the spirit and scope of the invention.

What is claimed is:

1. In a photon energy detector, an oscillator for producing a cyclical output signal having alternate first and second half cycles, the oscillator including a timing circuit having a PIN diode and a PN diode, the PIN diode exhibiting a reverse leakage current responsive to the photon energy incident upon the diode, the timing circuit defining the duration of the first half cycles of the output signal as a function of the reverse leakage current through the PIN diode when photon energy is incident upon the PIN diode and as a function of the forward drive current through the PN diode when photon energy is not incident upon the PIN diode, and the timing circuit defining the duration of the second half cycles of the output signal as a function of the forward drive current through the PIN diode when the PIN diode has continuity and as a function of the reverse leakage current through the PN diode when the PIN diode does not have continuity, whereby the duration of the first half cycles of the output signal is responsive to the photon energy incident upon the PIN diode and the duration of the second half cycles of the output signal is responsive to the continuity of the PIN diode.

2. In a photon energy detector, a relaxation oscillator for producing a cyclical output signal having alternate first and second half cycles, the oscillator including a resistance-capacitance timing circuit for defining the duration of the first half cycles as a function of the current flow through the resistance in a first direction and for defining the duration of the second half cycles as a function of the current flow through the resistance in a second direction, the resistance including a resistive network having first and second legs connected in parallel, the first leg including a PIN diode and a first resistance connected in series, the PIN diode exhibiting a reverse leakage current responsive to the photon energy incident upon the diode, the second leg including a PN diode and a second resistance connected in series, the PN diode poled in the first direction and the PIN diode poled in the second direction, and the first resistance substantially less than the second resistance, the current flow in the first direction thereby primarily defined as a function of the reverse leakage current through the PIN diode when photon energy is incident upon the PIN diode and primarily defined as a function of the forward drive current through the PN diode when photon energy is not incident upon the PIN diode, and the current flow in the second direction thereby primarily defined as a function of the forward drive current through the PIN diode when the PIN diode has continuity and primarily defined as a function of the reverse leakage current through the PN diode when the PIN diode does not have continuity, whereby the duration of the first half cycles is responsive to the photon energy incident upon the PIN diode and the duration of the second half cycles is responsive to the continuity of the PIN diode.

3. In a photon energy detector, an oscillator for producing a cyclical output signal having alternate first and second half cycles, the oscillator including a timing circuit for defining the duration of the alternate first and second half cycles, the timing circuit including a capacitor connected with a resistor network for defining the duration of the first half cycles as a function of the current flow through the resistor network in a first direction and for defining the duration of the second half cycles as a function of the current flow through the resistor network in a second direction, the resistor network having first and second legs connected in parallel, the first leg including a photo diode alternately connected in series with an oppositely poled first steering diode and a first resistor and in series with a like poled second steering diode and a second resistor, the photo diode exhibiting a reverse leakage current which is responsive to the photon energy incident upon the diode, the second leg including a control diode alternately connected in series with an oppositely poled third steering diode and in series with a third resistor, the control diode poled in the first direction and the photo diode poled in the second direction, and the first resistor much smaller than the third resistor, the resistor network thereby defining the current flow in the first direction as primarily a function of the reverse leakage current of the photo diode limited by the first resistor through the first steering diode when photon energy is incident upon the photo diode and as primarily a function of the forward drive current through the control diode limited by the third resistor when photon energy is not incident upon the photo diode, and the resistor network defining the current flow in the second direction as primarily a function of the forward drive current of the photo diode limited by the second resistor through the second steering diode when the photo diode has continuity and as primarily a function of the reverse leakage current of the control diode through the third steering diode when the photo diode does not have continuity; and an integrator connected to the oscillator for averaging the alternate first and second half cycles of the output signal to provide an output level having a magnitude responsive to the photon energy incident upon the photo diode and responsive to the continuity of the photo diode.

* * * * *